United States Patent
Haimi-Cohen et al.

(10) Patent No.: US 11,153,587 B2
(45) Date of Patent: Oct. 19, 2021

(54) COMPRESSIVE SENSING WITH JOINT SIGNAL COMPRESSION AND QUALITY CONTROL

(71) Applicant: Alcatel-Lucent USA Inc., Murray Hill, NJ (US)

(72) Inventors: Raziel Haimi-Cohen, Springfield, NJ (US); Xin Yuan, New Providence, NJ (US)

(73) Assignee: Nokia of America Corporation, Murray Hill, NJ (US)

(*) Notice: Subject to any disclaimer, the term of this patent is extended or adjusted under 35 U.S.C. 154(b) by 94 days.

(21) Appl. No.: 16/556,627

(22) Filed: Aug. 30, 2019

(65) Prior Publication Data
US 2019/0387240 A1    Dec. 19, 2019

Related U.S. Application Data

(62) Division of application No. 15/398,992, filed on Jan. 5, 2017, now Pat. No. 10,440,376.

(51) Int. Cl.
*G06K 9/00* (2006.01)
*H04N 19/426* (2014.01)
(Continued)

(52) U.S. Cl.
CPC ........ *H04N 19/426* (2014.11); *H03M 7/3062* (2013.01); *H04N 19/124* (2014.11);
(Continued)

(58) Field of Classification Search
CPC .... H04N 19/124; H04N 19/176; H04N 19/61; H04N 19/60; H04N 19/126; H04N 19/14; H04N 19/17; H04N 19/63; H04N 19/154; H04N 19/186; H04N 19/625; H04N 19/115; H04N 19/136; H04N 19/182; H04N 19/146; H04N 19/172; H04N 19/18; H04N 19/46; H04N 19/162; G06T 9/00;
(Continued)

(56) References Cited

U.S. PATENT DOCUMENTS

| | | | |
|---|---|---|---|
| 2006/0067584 A1* | 3/2006 | Sato | H04N 19/60 382/239 |
| 2009/0161753 A1* | 6/2009 | Youn | H04N 19/428 375/240.01 |
| 2014/0098856 A1* | 4/2014 | Gu | H04N 19/61 375/240.03 |

OTHER PUBLICATIONS

International Preliminary Report on Patentability dated Jul. 18, 2019 for International Application No. PCT/US2018/012164, 7 pages.

(Continued)

*Primary Examiner* — Alex Kok S Liew
(74) *Attorney, Agent, or Firm* — Duft & Bornsen, PC

(57) ABSTRACT

An encoder determines a compression ratio for compressive sensing and a quantization level used to quantize a media signal based on a target indicator. The encoder accesses compressive sensing measurements performed using the compression ratio and quantizes the compressive sensing measurements based on the quantization level. A decoder receives a compressed signal generated from the signal acquired by the signal acquisition device using the compression ratio and the quantization level. The decoder also receives information indicating the compression ratio or the quantization level. The decoder decompresses the compressed signal based on the compression ratio and the quantization level.

9 Claims, 7 Drawing Sheets

(51) Int. Cl.
  *H04N 19/124* (2014.01)
  *H04N 19/94* (2014.01)
  *H04N 19/44* (2014.01)
  *H04N 19/132* (2014.01)
  *H04N 19/146* (2014.01)
  *H04N 19/154* (2014.01)
  *H04N 19/172* (2014.01)
  *H03M 7/30* (2006.01)

(52) U.S. Cl.
  CPC ......... *H04N 19/132* (2014.11); *H04N 19/146* (2014.11); *H04N 19/154* (2014.11); *H04N 19/172* (2014.11); *H04N 19/44* (2014.11); *H04N 19/94* (2014.11)

(58) Field of Classification Search
  CPC ........... G06T 9/007; G06T 9/40; G06T 9/008; G06T 1/00; G06T 1/0028; G06T 2201/0051; G06T 2201/0061; G06T 2201/0201; G06T 2207/10024; G06T 2207/20021; G06T 2207/20044; G06T 2207/20084
  See application file for complete search history.

(56) References Cited

OTHER PUBLICATIONS

Office Action dated Sep. 23, 2020 for European Application No. 18709111.1, 6 pages.

* cited by examiner

COMPRESSIVE SENSING WITH JOINT SIGNAL COMPRESSION AND QUALITY CONTROL

CROSS-REFERENCE TO RELATED APPLICATIONS

The presentation application is a divisional application of U.S. patent application Ser. No. 15/398,992, entitled "COMPRESSIVE SENSING WITH JOINT SIGNAL COMPRESSION AND QUALITY CONTROL" and filed on Jan. 5, 2017, the entirety of which is incorporated by reference herein.

BACKGROUND

Processing media signals such as voice, audio, still images, video, and the like includes storage or transmission of the media signals. As used herein, the term "transmission" includes writing information into a storage medium and reading information from the storage medium. Although the storage capacity and transmission bandwidth available for processing media signals have grown tremendously in the last few decades, the demand for storage capacity and transmission bandwidth has been increasing even faster. Thus, in practice, effective signal compression is essential for media distribution and processing.

A typical signal compression system comprises an encoder and a decoder. The encoder receives the signal and produces a sequence of channel symbols, which are transmitted on a communication channel to the decoder. The decoder receives the sequence of channel symbols over the communication channel and (exactly or approximately) reconstructs the original signal based on the received sequence. A figure of merit that indicates the achieved compression is the compressed data size, that is, the number of channel symbols in the sequence. If the signal is defined in a domain of indefinite size, e.g., radio or television channels that have no specific beginning or end time, the achieved compression is often measured by the data rate, that is, the number of channel symbols per time unit. Thus, the terms "compressed data size" and "data rate" can be used interchangeably to refer to a figure of merit that represents the achieved compression. The channel symbols are taken from a finite set, known as the channel alphabet, which is specific to the communication channel. The simple and most ubiquitous channel alphabet is {0,1}, where the channel symbols are bits. In this case the term "bit rate" is often used instead of "data rate."

Some signal compression systems are lossless so that the reconstructed signal produced by the decoder is identical to the input signal that was compressed by the encoder. However, in most cases, the decoder is only able to reconstruct an approximate signal from the compressed data that is received over the communication channel. In that case, the quality of the decoded signal is measured by comparing it to the original signal and computing a distance measure between them, e.g., by treating the difference between the original and decoded signals as noise and computing the signal to noise ratio. Other distance measures are based on human perception and attempt to represent the degree to which the differences between the images are noticeable or objectionable to people. The performance of a signal compression method is described by both the compressed data rate and the decoded image quality.

A typical signal encoder processes its input in the following four steps:
1. Sampling: The signal is converted into an array of digital samples. If the signal has no definite begin and end points, the encoder repeatedly selects a finite "frame" for processing and the four steps are performed repeatedly for each frame.
2. Analysis: An array of parameters that characterizes (exactly or approximately) the signal is computed. Most of these parameters are real numbers.
3. Quantization: The array of parameters is mapped into an array of labels (not necessarily of the same dimension), where the labels are taken from one or more finite codebooks. Quantization is a lossy operation. Similar but non-identical signals may be quantized into the exact same array of labels, and after quantization there is no way to determine which of them was the original signal. The error introduced by the quantization is determined by the quantization level which specifies the granularity, or coarseness of the quantization. The quantization level may be specified in terms of a quantization step or other similar parameters of the specific quantization scheme. In the nomenclature used herein, higher quantization level implies coarser quantization.
4. Channel coding: The array of labels is converted into a sequence of channel symbols that is ready for transmission. Typically, this operation is lossless, that is, the array of labels is uniquely determined by the corresponding sequence of channel symbols.

The signal decoder reverses the steps performed by the encoder. Channel decoding computes the quantization labels from the channel symbols; dequantization estimates the analysis parameters from the array of labels, a synthesis step generates an estimated digital signal from the analysis parameters and, if the signal has to be rendered, digital to analog conversion renders the decoded signal.

Many signal encoders provide means to control the tradeoff between compressed data rate and reconstructed signal quality by allowing the user to control the level of quantization, that is, its coarseness. Interfaces to entities that are able to control the quantization level may have several forms:
1. Open-ended: A quantization level is specified. Higher (coarser) quantization levels result in lower compressed data rates and lower decoded signal quality, but there is no specific guarantee for the actual data rate or quality of the given signal.
2. Constrained data rate: A maximal data rate is specified and the quantization level which is used is the lowest possible level that results in a data rate not exceeding the specified maximum.
3. Constrained decoded quality: A minimal decoded signal quality is specified and the quantization level which is used is the highest possible level that results in a decoded signal quality not lower than the specified minimum.

In interfaces 2 and 3 it is often necessary to repeat the encoding several times, until a quantization level is found that meets the requirements. Interface 3 also requires the encoder to have full knowledge of the decoder. In some cases, interface 3 includes an implementation of the decoder in order to compute the decoded signal and test its quality. Because of this added complexity, many signal compression standards incorporate only an open-ended type of quality/ rate control interface, assuming that if necessary, interfaces of type 2 or 3 can be built at the application level on top of an interface of type 1.

If the signal is an image, step 1 ("sampling") of the signal encoding scheme above is commonly performed by a conventional digital image acquisition system, which requires deploying an array of detectors at an image plane of an image acquisition device and exposing the array of detectors to light received from a scene. The detectors generate signals that are proportional to the intensity of the light falling on the detector. A complete image of the scene is produced by sampling the intensities generated by the array of detectors. Each detector corresponds to a pixel of the acquired image. As used herein, the term "pixel" refers to a single scalar element of a multi-component representation of the image. Acquiring the information representative of the portion of the image represented by each pixel therefore requires performing a separate measurement of the intensity of the light falling on the detector corresponding to the pixel. Consequently, the number of detectors and the number of measurements required to produce an image in a conventional digital acquisition system is equal to the number of pixels used to represent the image. Once the image has been sampled, a conventional image compression algorithm, such as JPEG or JPEG 2000, is used to compress the image using steps 2-4 above.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
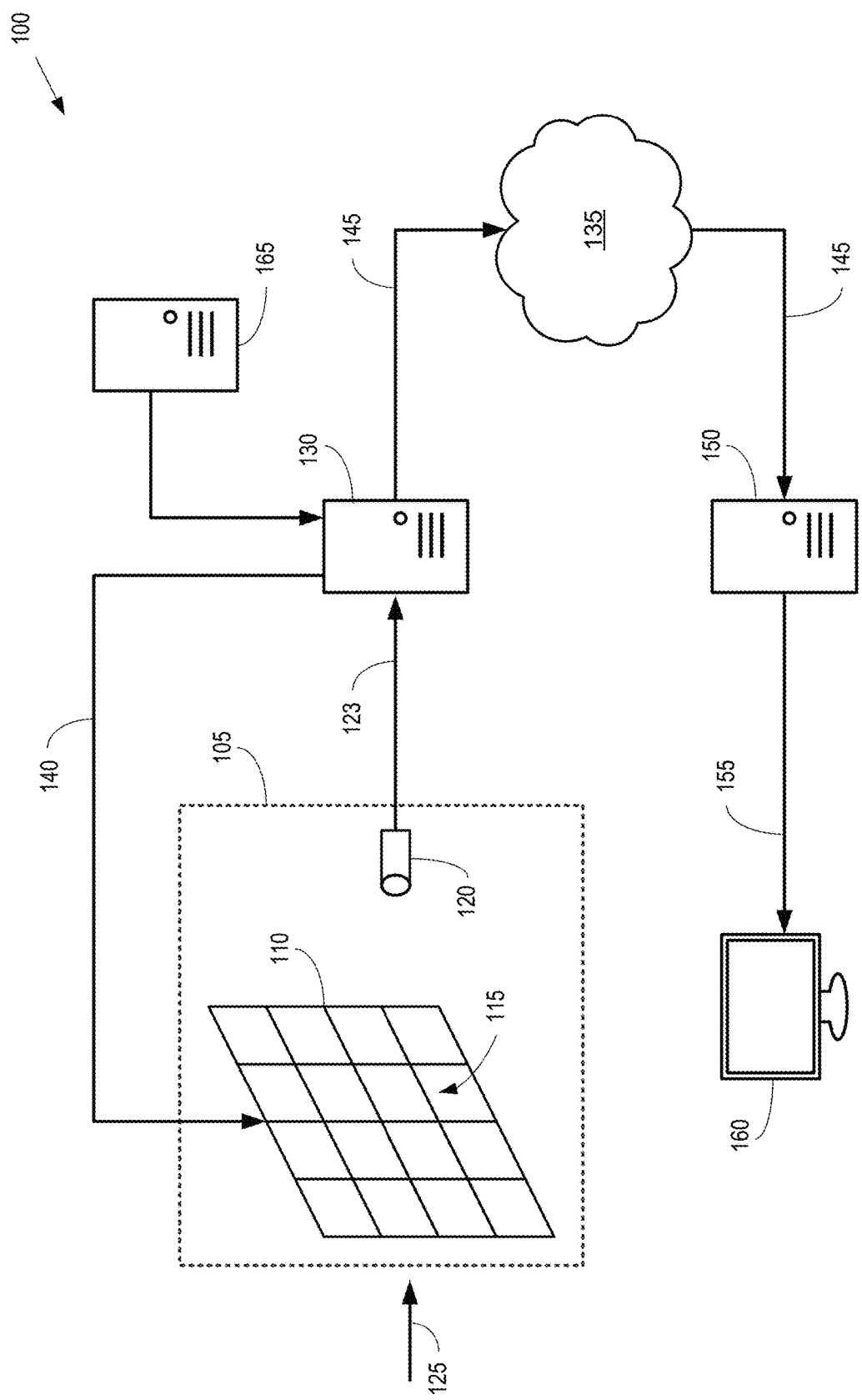
FIG. 1 is a diagram of a first example of an image acquisition and display system that performs compressive sensing and data compression according to some embodiments.

Compressive sensing is a signal processing technique for efficiently acquiring and reconstructing a signal by finding solutions to undetermined linear systems. Let x be a vector of dimension N, which contains the samples of a signal known to have some special properties, such as being sparse, or low-rank, when projected unto an appropriate vector space. Compressive sensing is a way to represent x by a measurements vector y of a lower dimension M<N, and in some cases a much lower dimension, M□N, in such a way that x can be reconstructed, exactly or approximately, given A and y, by leveraging knowledge of the special properties of x. The measurements vector y is computed by $$y=Ax \qquad (1)$$

where A is a M×N matrix known as the sensing matrix. If x is derived from an analog signal x̃ by sampling, then the equivalent of eq. (1) can sometimes be performed in the analog domain on x̃, thus making it unnecessary to generate the sampled signal x at all.

While the generation of the measurements vector is straightforward, the reconstruction of the signal from the measurements vector is a complex operation, which usually involves solving of a constrained minimization problem iteratively. The performance of a compressive sensing system is measured by the quality of the reconstructed signal (in reference to the original signal) and the compression ratio M/N. Performance curves that depict the quality versus the compression ratio are typically used to represent the performance of a compressive sensing system.

Media signals usually have special properties that make it possible to reconstruct them, at least approximately, from a measurements vector of a much lower dimension than the original sampled signal. Therefore, compressive sensing is of interest from the point of view of signal compression. However, a compressive sensing system is not a complete signal compression system, because the output of the measurements operation of Eq. (1) is not a bit sequence or, more generally, a sequence of channel symbols, but an array of real numbers. In this respect, the measurement operation is equivalent to the analysis step of a signal compression encoder or, if the measurements operation is implemented in the analog domain, it is equivalent to a combination of the sampling and the analysis steps performed by the encoder. If one converts the measurements into a sequence of bits by using the bit pattern in which each measurement is natively represented in a computer, that is, by a single or double precision floating point number (32 or 64 bit, respectively), then the performance of the resulting system, in terms of quality versus data rate, is quite poor in comparison to conventional signal compression systems.

In some systems of image compression based on compressive sensing, the analysis step is performed by the encoder according to eq. (1). This computation is done either digitally, in which case the pixel of the image is sampled first using a conventional image acquisition system, or alternatively, the computation of eq. (1) is done in the electro-optical analog domain, in which case it may not be necessary to acquire the samples explicitly. Once the measurements are obtained, they are quantized into a sequence of labels selected from a finite codebook. Channel encoding can be applied to the label sequence to represent the label sequence as a bit sequence. The channel coding method may be based on entropy coding, in order to further reduce the data rate. The label sequence is reconstructed from the encoded bit sequence and the compressive sensing measurements are estimated from the label sequence. An estimated image is then reconstructed from the estimated compressive sensing measurements. In systems that implement this type of compressive sensing algorithm, the characteristics of the quantizer are fixed and the quality of the decoded image, as well as the size (i.e. the data rate) of the compressed bit sequence, are determined by varying the number of measurements obtained by the compressive sensing algorithm. However, these compressive sensing systems typically require a significantly higher bit rate than conventional compression techniques (such as JPEG compression of images) in order to achieve the same quality in the decompressed signal.

A signal compression system based on compressive sensing could have some important advantages for certain applications. For example, the signal acquisition device and encoder can be relatively simple, low-cost and low-power, e.g., a lens-less camera can be used to acquire images (see U.S. Pat. No. 8,644,376, which is incorporated herein by reference in its entirety). For another example, the compressed signal is inherently robust to data loss in communication, which reduces or eliminates the need for error correction techniques such as forward error correction or retransmission of data (see U.S. Patent Application Publication No. 20160249065, which is incorporated herein by reference in its entirety). For yet another example, anomalies or events of interest can be detected in the compressed signal without decompressing the signal (see U.S. Patent Application Publication No. 2014/0043491 A1, which is incorporated herein by reference in its entirety and U.S. Patent Application Publication No. 2015/0178945 A1, which is incorporated herein by reference in its entirety).

The bit rate required to transmit a compressed signal generated using compressive sensing techniques can be reduced, while maintaining the quality level of the decompressed signal, by determining a compression ratio for compressive sensing of a scene and a quantization level used to quantize the measurements acquired by compressive sensing based on a target indicator. The target indicator is a parameter that is used to control both the compression ratio and the quantization level. Varying the target indicator causes both compression ratio and quantization level to change, but not necessarily in a linear way. In some regions of the operating range of the target indicator, small changes in the target indicator result in large changes in the compression ratio with little effect on the quantization level, and vice versa. Examples of the target indicator are a target bit rate for the compressed image, or a target quality for the reconstructed image. Note that selecting a compression ratio and a measurements quantization level based on a target bit rate or a target reconstructed image quality does not necessarily ensure that the specified target is exactly achieved. Therefore, the target indicator is an open-ended interface to a data rate and quality control entity.

In some embodiments, the compression ratio and the quantization level are determined using a functional relationship between a number of quantization steps, or the size of a quantization step and a number of compressive sensing measurements. For example, the functional relationship can specify that a product of a size of a quantization step and a number of compressive sensing measurements is equal to a constant, which is determined empirically by compressing one or more test images using different quantization granularities and compression ratios for compressive sensing of the image. Measures of qualities of the decompressed images produced from the compressed test images are then compared to determine the combination of quantization granularity and number of compressive sensing measurements that produces the highest quality decompressed image. Different functional relationships can be determined for different types of images such as color images or black-and-white images, or based on statistical characterizations of the images such as dynamic ranges in the pixel values, average pixel values, and the like. In the case of functional relationship, the target indicator may be the compression ratio itself, and the quantization level is derived from the compression ratio in a non-linear fashion, or alternatively, the target indicator is the target indicator is the measurements quantization level, and the compression ratio is derived from it in a non-linear way.

FIG. 1 is a diagram of a first example of an image acquisition and display system 100 that performs compressive sensing and data compression according to some embodiments. The image acquisition and display system 100 includes an image acquisition device, which in the illustrated embodiment is a lensless camera 105. An example of a lensless camera such as the lensless camera 105 shown in FIG. 1 is described in U.S. Patent Application Publication No. 2013/0201297, which is incorporated herein by reference in its entirety. In the embodiments described herein the media signals are monochrome still images and the channel symbols are bits. However, other embodiments of the techniques disclosed herein can be used to perform compressive sensing or data compression of other media signals, such as video, audio, or speech, as well as other types of channel symbols.

The lensless camera 105 includes a shutter array 110 that includes a plurality of shutters 115 (only one indicated by a reference numeral in the interest of clarity) that can each be independently opened to allow light to pass through the corresponding shutter 115 or closed to prevent light from passing through the corresponding shutter 115. Some embodiments of the shutters 115 in the shutter array 110 are implemented as an array of LCD elements that are selectively opened or closed on the basis of signals provided to the LCD elements. The lensless camera 105 also includes a sensor 120 that can be implemented using one or more photodiodes. In the interest of clarity, only one sensor 120 is shown in FIG. 1. However, some embodiments of the lensless camera 105 include more than one sensor. Light 125 that arrives from one or more objects in a scene passes through the open portion of the shutters 115 and strikes the sensor 120, which generates an output signal 123 representative of the intensity of the incident light 125.

The image acquisition and display system 100 includes an encoding controller 130 that generates signals to selectively open or close the shutters 115. Some embodiments of the encoding controller 130 determine subsets of the shutters 115 that are opened during a sequence of time intervals. For example, if N is the total number of shutters 115 in the shutter array 110 and M is the number of time intervals in the sequence, the encoding controller 130 generates an M×N sensing matrix, A, which has M rows and N columns. Each entry in the sensing matrix has a value that indicates whether the corresponding shutter 115 is opened or closed during the different time intervals. For example, a value of 1 in the m-th row and n-th column indicates that the n-th shutter 115 is opened during the m-th time interval. For another example, a value of 0 in the m-th row and n-th column indicates that the n-th shutter 115 is closed during the m-th time interval. In some embodiments, the number of time intervals is less than the number of shutters 115, e.g., M<N.

The sensing matrix can be implemented based on a modified N×N Walsh-Hadamard matrix. A Walsh-Hadamard matrix includes entries with values of 1 and −1. A modified Hadamard matrix can be obtained, for example, with the following three steps: (1) replace the value −1 in the N×N Hadamard matrix by value 0, (2) randomly permute the columns of the matrix obtained from (1), and (3) randomly select M rows from the N rows of the matrix obtained from (2). The encoding controller 130 generates signals to open or close the shutters 115 during each time interval according to the values of entries in the corresponding row of the sensing matrix, which is generated by the encoding controller 130 or generated elsewhere and made known and accessible to the encoding controller 130. The encoding controller 130 then provides control signals 140 to the lensless camera 105 to control operation of the shutter array 110.

Once shutters 115 have been opened or closed to produce an aperture pattern for a time interval, the sensor 120 begins to integrate the intensity of the light 125 arriving from the scene through the open shutters during the time interval. The integration continues until the end of the time interval so that the sensor 120 obtains one measurement per time interval corresponding to the aperture patterns of the shutter array 110. Thus, the sensor 120 performs M measurements for the aperture patterns defined by the M rows of the sensing matrix. The sensor 120 generates a measurements vector. For example, the measurement vector y can be expressed as:

$$y = \begin{bmatrix} y_1 \\ \vdots \\ y_M \end{bmatrix}$$

Each of the entries of the measurements vector is a measurement of a vector of image pixels, produced by the sensor 120. The number of image pixels is equal to the number N of shutters 115. The vectors, x, of image pixels can be expressed as:

$$x = \begin{bmatrix} x_1 \\ \vdots \\ x_N \end{bmatrix}$$

The measurement vectors and the vectors of image pixels are related by the sensing matrix according to eq. (1). Thus, compressive sensing according to the sensing matrix A produces a measurement vector y that has a lower dimension (i.e., has fewer elements) than the corresponding vector of the image pixels. In other words, the number of measurements made by the sensor 120 is less than, and can be significantly less than, the number of pixels of the image from the sensor 120 and in this sense, compression of the images is achieved during the acquisition.

The lensless camera 105 provides an output signal 123 representative of the measurements vector acquired by compressive sensing to the encoding controller 130. The encoding controller 130 is configured to encode the output signal 123 to generate an encoded signal 145 for transmission over a network 135 to a decoding processor 150. Encoding the output signal 123 to form the encoded signal 145 includes quantizing the compressive sensing measurements and performing lossless compression (e.g., entropy encoding) on the quantized values of the compressive sensing measurements, as discussed below. The decoding processor 150 performs lossless decompression on the encoded signal 145 and then dequantizes the decompressed signal. The decoding processor 150 then performs image reconstruction on the dequantized, decompressed signal to generate a reconstructed signal 155 representative of a reconstructed image having N pixels from the smaller number (M) of measurements performed during the sequence of time intervals.

Compressive sensing/reconstruction, quantization, and compression are discussed in Haimi-Cohen and Lai ("Compressive measurements generated by structurally random matrices: Asymptotic normality and quantization," *Signal Processing* 120 (2016), pgs. 71-87), which is incorporated herein by reference in its entirety.

Some embodiments of the decoding processor 150 are configured to perform image reconstruction on the measurement vectors generated by the sensor 120 by solving the minimization problem:

$$\text{minimize} \|Wx\|_1 \text{ such that } y = Ax$$

where W is a sparsifying operator such as a total variation operator or a wavelet operator and y, A, and x are defined as above. For another example, if the sensor 120 is implemented as a plurality of sensors 1 . . . S, the decoding processor 150 can be configured to generate a common image x from the measurements performed by all of the sensors. The common image x is created by solving the minimization problem:

$$\text{minimize} \|Wx\|_1 \text{ such that } \begin{bmatrix} y^1 \\ \vdots \\ y^S \end{bmatrix} = \begin{bmatrix} AP^1 \\ \vdots \\ AP^S \end{bmatrix} x$$

where $P^i$ represents a projection from the common image x to the image $x^i$ associated with the sensor i, and y, A, and x are defined as above. In some embodiments, the generation of the images as described above can be performed by a processor implemented in a location outside of the processor 150. For example, the image acquisition and display system 100 may transmit the measurements vector to a device in another location, such as a cloud server implemented in a cloud, and the device in the other location can perform the process described above to generate the images. The reconstructed signal 155 is provided to a screen 160 and the corresponding reconstructed image can be displayed on the screen 160.

The perceived quality of the reconstructed image displayed on the screen 160 is typically determined by a compression ratio used to acquire compressive sensing measurements and a quantization level used to quantize the compressive sensing measurements. As discussed herein, conventional image compression systems based on compressive sensing typically require a significantly higher bit rate than conventional compression techniques (such as JPEG compression of images or MPEG-4 compression of video) to achieve the same quality in the reconstructed image. Some embodiments of the image acquisition and display system 100 generate encoded signals 145 at a reduced bit rate relative to conventional compressive sensing, while maintaining the quality level of the reconstructed signal 155 provided to the screen 160 using joint control of the compression ratio used to perform compressive sensing and the quantization level used to quantize the compressive sensing measurements. For example, the encoding controller 130 is configured to determine a compression ratio for compressive sensing of a scene by the lensless camera 105 and a quantization level used to quantize the compressive sensing measurements acquired by the lensless camera 105 based on a target indicator of a size of a compressed image of the scene or a quality of a reconstructed image of the scene. The encoding controller 130 transmits the compression ratio to the lensless camera 105 using the control signaling 140. The encoding controller 130 also quantizes the output signal 123 received from the lensless camera 105 based on the quantization level. The decoding processor 150 can then decompress, dequantize, and perform compressive sensing reconstruction on the encoded signal 145 to generate the reconstructed signal 155.

The encoding controller 130 jointly determines the compression ratio and the quantization level based on a functional relationship between these variables. For example, if the quantizer is a scalar uniform quantizer, the functional relationship can specify that a product of a quantization level, expressed in terms of a quantization step, and a compression ratio is equal to a constant. For another example, the functional relationship can specify that a quotient of the quantization level and the compression ratio is equal to a constant if the quantization level is given by the number of labels in the codebook. In the case of a scalar uniform quantizer, this functional relationship is equivalent to the previous one because in this quantizer the step size is inversely proportional. However, the functional relationship of the latter example may be useful with non-uniform quantizers, where the step size is not constant.

In some embodiments, the functional relationship is determined by an external processor 165 and then provided to the encoding controller 130 prior to or concurrently with acquisition of images. The external processor 165 can be implemented using a transceiver, one or more processors, and one or more memories, as discussed herein. The external processor 165 determines the functional relationship by performing image compression on one or more test images using different combinations of compression ratios and quantization levels and then evaluating the data rate and the quality of the reconstructed image for each combination of compression ratio and quantization level. For example, the external processor 165 can perform compressive sensing on one or more test images based on a set of compression ratios. The external processor 165 quantizes the compressive sensing measurements using a set of quantization granularities. The external processor 165 then determines parameters in the functional relationship (such as the constant discussed above) based on measures of qualities of decompressed test images formed based on the quantized test signals. Although the external processor 165 is depicted as an entity different from the encoding controller 130 in FIG. 1, some embodiments of the image acquisition and display system 100 implement the external processor 165 and the encoding controller 130 in the same physical device.

Figure 2:
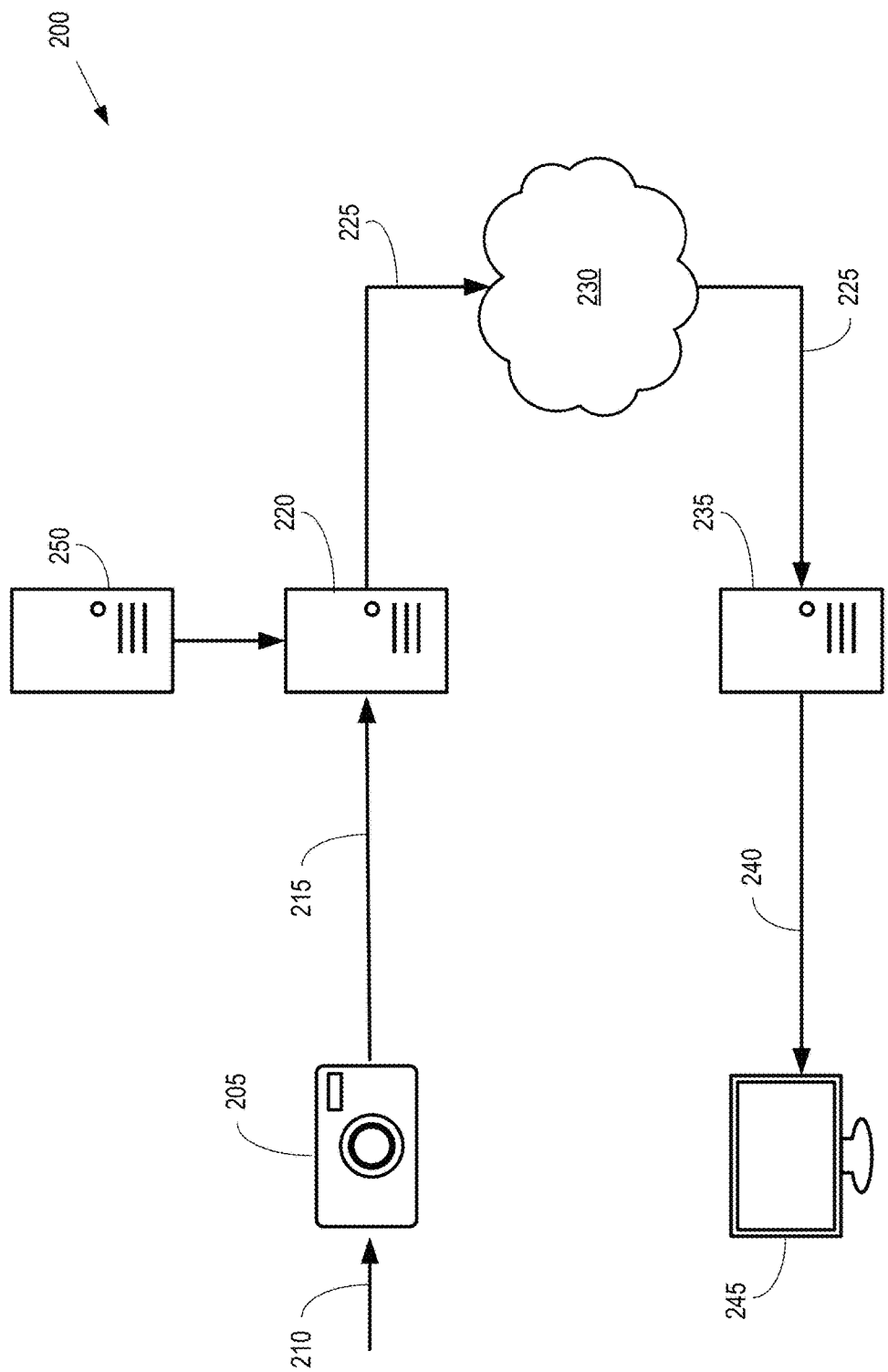
FIG. 2 is a diagram of a second example of an image acquisition and display system that performs compressive sensing and data compression according to some embodiments.

FIG. 2 is a diagram of a second example of an image acquisition and display system 200 that performs compressive sensing and data compression according to some embodiments. The image acquisition and display system 200 includes an image acquisition device, which in the illustrated embodiment is a camera 205. The second example of the image acquisition and display system 200 shown in FIG. 2 differs from the first example of the image acquisition and display system 100 shown in FIG. 1 in at least two respects. First, the camera 205 includes a conventional array of detectors (such as charge coupled devices, CCDs) that produce signals representative of the color and intensity of the incident light 210 that passes through a shutter of the camera 205 and falls on the array. Thus, the camera 205 is not configured to perform compressive sensing and the number of measurements performed by the camera 205 is equal to the number of pixels in the acquired image. The camera 205 provides an output signal 215 representative of the image captured by the array to an encoding controller 220. Second, the encoding controller 220 is configured to apply a sensing matrix to the output signal 215 to generate compressive sensing measurements, as discussed herein. For example, if the camera 205 produces an image including N pixels, the encoding controller 220 can apply an M×N sensing matrix to generate M compressive sensing measurements.

The encoding controller 220 is also configured to generate an encoded signal 225 for transmission over a network 230 to a decoding processor 235. Generating the encoded signal 225 includes quantizing the compressive sensing measurements generated by applying the sensing matrix to the output signal 215 and performing lossless compression (e.g., entropy coding) on the quantized values of the compressive sensing measurements. The decoding processor 235 performs lossless decompression on the encoded signal 225 and dequantizes the decompressed signal. The decoding processor 235 then performs image reconstruction on the dequantized, decompressed signal to generate a reconstructed signal 240 representative of a reconstructed image having N pixels from the smaller number (M) of measurements performed during the sequence of time intervals. The reconstructed signal 240 is provided to a screen 245 and the corresponding reconstructed image can be displayed on the screen 245.

The encoding controller 220 implements joint control of the compression ratio used to perform compressive sensing and the quantization level used to quantize the compressive sensing measurements. For example, the encoding controller 220 is configured to determine a compression ratio for compressive sensing and then define a sensing matrix based on the determined compression ratio. The encoding controller 220 is also configured to determine a quantization level used to quantize the compressive sensing measurements generated by applying the sensing matrix to the output signal 215 provided by the camera 205. Both the compression ratio and the quantization level are determined based on a target indicator of a size of a compressed image of the scene or a quality of a reconstructed image of the scene. Some embodiments of the encoding controller 220 determine the compression ratio and the quantization level based on a functional relationship that is determined by an external processor 250 and provided to the encoding controller 220, as discussed herein.

Figure 3:
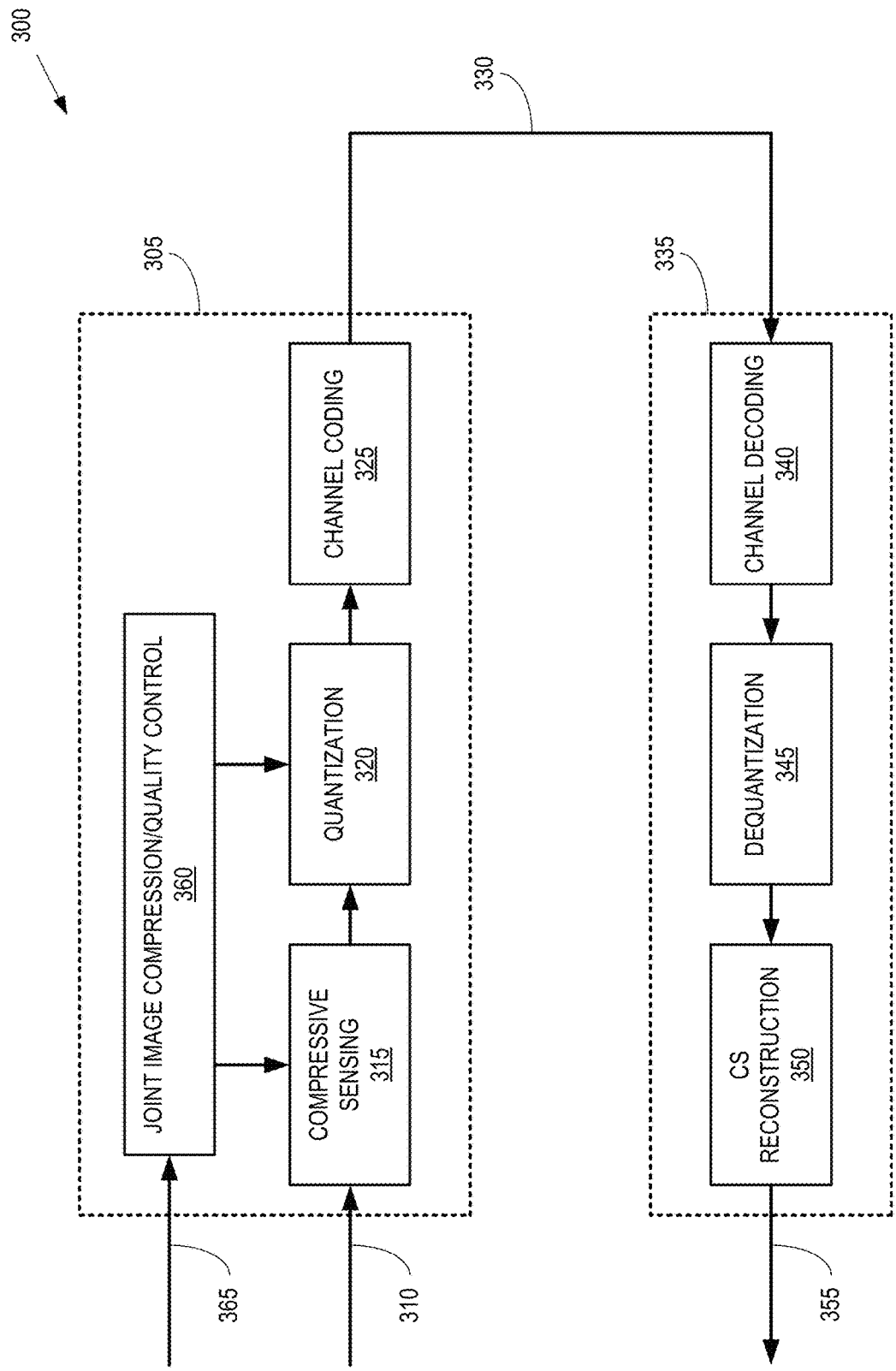
FIG. 3 is a block diagram of a processing system configured to perform encoding and decoding of signals representative of an image according to some embodiments.

FIG. 3 is a functional block diagram of a processing system 300 configured to perform encoding and decoding of signals representative of an image according to some embodiments. Elements of the processing system 300 are used to implement corresponding elements in some embodiments of the image acquisition and display system 100 shown in FIG. 1 and the image acquisition and display system 200 shown in FIG. 2.

The processing system includes an encoder 305 that receives an input signal 310 including information representative of values of pixels in an original image provided by an image acquisition device. In the illustrated embodiment, the encoder 305 includes a compressive sensing module 315 that generates a sensing matrix and applies the sensing matrix to the input signal 310 to generate compressive sensing measurements, as discussed herein. The compressive sensing module 315 performs lossy compression by projecting the input signal 310 onto a selected subspace defined by the sensing matrix. Thus, the compressive sensing measurements do not necessarily include all the information in the input signal 310. Since the encoder 305 includes the compressive sensing module 315, the encoder 305 can be implemented in some embodiments of the encoding controller 220 shown in FIG. 2. However, in other embodiments, the compressive sensing module 315 generates the sensing matrix and then provides information identifying the sensing matrix to an image acquisition device such as the lensless camera 105 shown in FIG. 1 so that the image acquisition device performs the compressive sensing. In that case, the encoder 305 can be implemented in some embodiments of the encoding controller 130 shown in FIG. 1.

The encoder 305 also includes a quantization module 320 that is used to quantize the compressive sensing measurements received from the compressive sensing module 315. The quantization module 320 quantizes the compressive sensing measurements into a sequence of labels selected from a finite codebook. In some embodiments the quantizer is scalar, that is, each measurement is quantized separately yielding a single label per measurement. Other embodiments employ vector quantization, where a group of measurements is mapped into a single label. In either case, quantization of the compressive sensing measurements reduces the information content in the quantized signal, hence the compression of the signal that results from converting the compressive sensing measurements into a sequence of labels is lossy.

The quantization module 320 is characterized by a quantization level, which is a parameter or a quantity that determines the granularity, or coarseness, of the quantization. The quantization level may have different forms, some of which may be equivalent to each other, and some of which may be specific to certain types of quantizers. For example, for a scalar uniform quantizer, the quantization level may be expressed by the quantization step size, which is the width of all quantization intervals (except for the outlier intervals that are outside the quantizer's range). For non-uniform quantizers, where the quantization intervals are of different sizes, the quantization level may be expressed by the number of labels in the codebook. The number of labels could also be used as the quantization level in a uniform quantizer, in which case it is inversely proportional to the quantization step and hence equivalent to it. Alternatively, the quantization level may be the average maximal quantization error, or the root mean square (RMS) of the quantization error, over all labels in the codebook for which the maximal quantization error is finite (that is, excluding the labels for outliers outside the quantizer's range). The entropy of the output of the quantizer, for an assumed input distribution, can also be used as a quantization level. In some of these types of quantization level, e.g. the quantizer's step size, increasing the quantization level results in coarser quantization and more accuracy loss, while in other types of quantization level, e.g. the number of labels in the codebook, increasing the quantization level results in finer quantization and less accuracy loss. In the interest of clarity, the following disclosure assumes that increasing the quantization level makes the quantization coarser. However, the disclosure applies equally to the case in which increasing the quantization level generates finer quantization.

The encoder 305 also includes a channel coding module 325 that performs lossless coding on the label sequence to generate a bit sequence 330 that represents the sequence of labels. Since the channel coding is lossless, the sequence of labels can be exactly recovered from the bit sequence 330. Some embodiments of the channel coding module 325 perform lossless channel coding using entropy coding. Some embodiments of the bit sequence 330, represent, in addition to the sequence of labels, one or more parameters that specify the encoding process, e.g. the quantization level, or other parameters that specify the format of the input image, e.g. the number of pixels in each dimension.

The bit sequence 330 is provided to a decoder 335 that can be implemented in some embodiments of the decoding processor 150 shown in FIG. 1 or the decoding processor 235 shown in FIG. 2. The decoder 335 includes an channel decoding module 340 for decompressing the bit sequence 330 to recover the sequence of labels representative of the quantized image signal. If the channel encoding module 325 is based on entropy coding, then decoding module 340 is based on a corresponding entropy decoding. A dequantization module 345 recovers an estimate of the compressive sensing measurements based on the sequence of labels and a compressive sensing reconstruction module 350 generates a reconstructed signal 355 that represents a reconstructed image representative of the scene. The reconstructed signal 355 can be provided to a screen such as the screen 160 shown in FIG. 1 and the screen 245 shown in FIG. 2.

A joint image compression/quality control module 360 provides control signaling to the compressive sensing module 315 and the quantization module 320. A signal 365 indicating a target indicator is input to the joint image compression/quality control module 360, which uses the target indicator to generate control signaling for both the compressive sensing module 315 and the quantization module 320. The control signaling provided to the compressive sensing module 315 includes information indicating a compression ratio for compressive sensing and the control signaling provided to the quantization module 320 includes information indicating a quantization level.

Some embodiments of the joint image compression/quality control module 360 determine the compression ratio and the quantization level based on a functional relationship between these variables. As discussed herein, information specifying the functional relationship between the compression ratio and the quantization level can be generated by an external processor such as the external processor 165 shown in FIG. 1 or the external processor 250 shown in FIG. 2. The information specifying the functional relationship is then provided to the joint image compression/quality control module 360, which uses this information to determine the compression ratio and the quantization level. The information specifying the functional relationship can be provided to the joint image compression/quality control module 360 prior to receiving the input signal 310 and then stored in a corresponding memory for subsequent use performing compressive sensing and quantization on the input signal 310.

Figure 4:
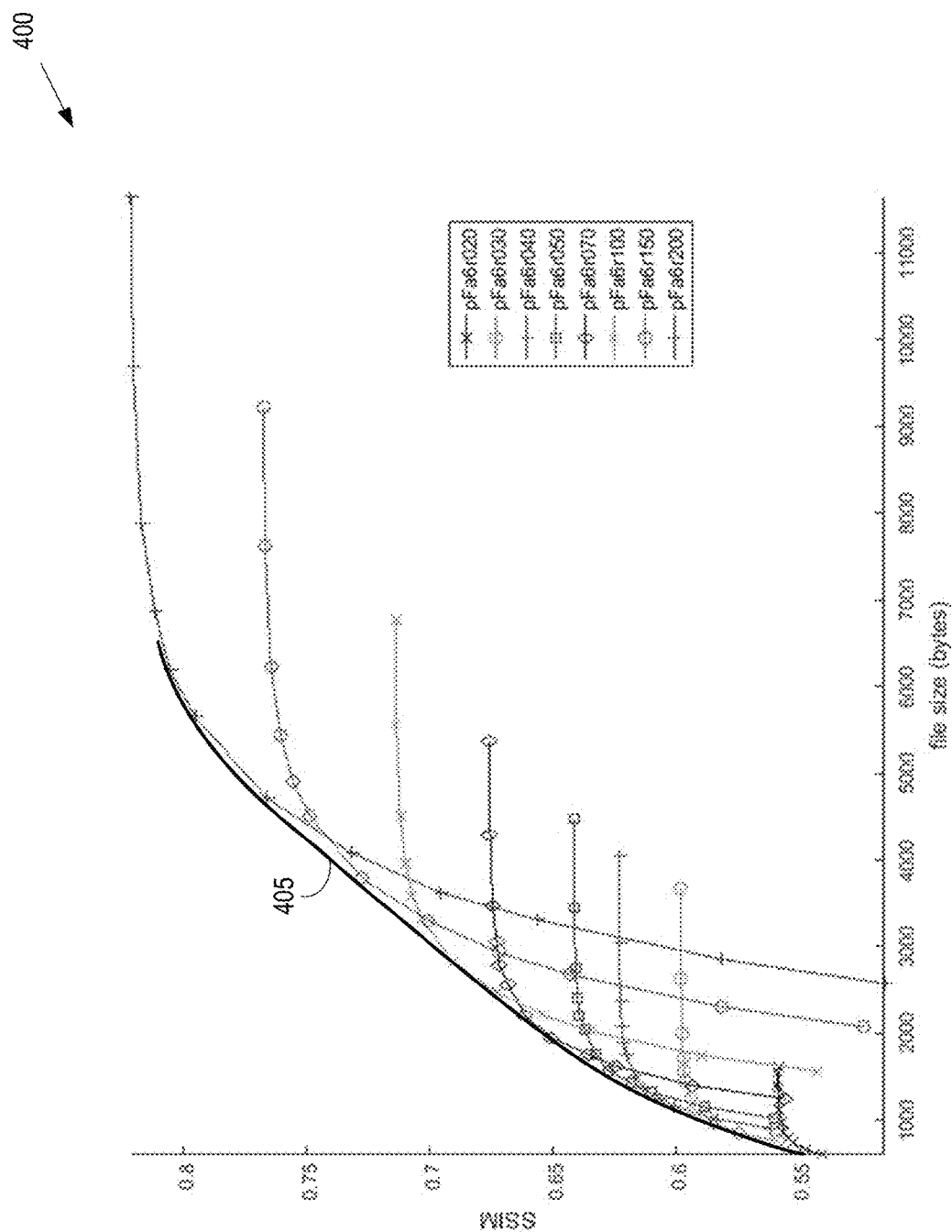
FIG. 4 is a plot illustrating a functional relationship between decoded image quality and compressed file size, for different choices of a compression ratio used for compressive sensing and a quantization level used to quantize the compressive sensing measurements according to some embodiments.

FIG. 4 is a plot 400 illustrating a functional relationship 405 between a compression ratio used for compressive sensing and a quantization level used to quantize the compressive sensing measurements according to some embodiments. The vertical axis in the plot 400 is a structural similarity (SSIM) index that represents a degree of similarity between a reconstructed image and a reference image. The SSIM index is a full reference metric, e.g., the measurement or prediction of image quality is based on an initial uncompressed or distortion-free reference image. The horizontal axis in the plot 400 indicates a number of bytes in the encoded image that is formed by performing compressive sensing on the reference image, quantizing the compressive sensing measurements, and encoding the quantized measurements using entropy coding to generate the bytes that represent the encoded image, as discussed herein. In some embodiments, information specifying the functional relationship between the compression ratio and the quantization level is generated by an external processor such as the external processor 165 shown in FIG. 1 or the external processor 250 shown in FIG. 2.

Each of the curves shown in FIG. 4 corresponds to a different compression ratio. For example, the curve labeled pFa6r020 has a compression ratio of 2%, which indicates that the ratio of compressive sensing measurements to pixels in the reconstructed image is 2:100. For another example, the curve labeled pFa6r200 has a compression ratio of 20%, which indicates that the ratio of compressive sensing measurements to pixels in the reconstructed image is 20:100. Reducing the number of measurements by reducing the compression ratio (which is equivalent to reducing the dimension of the compressive sensing subspace) decreases the data rate and the compressed image size. However, reducing the number of measurements also decreases the reconstructed image quality.

Each point on the curves shown in FIG. 4 corresponds to a different quantization level. Lower quantization levels (corresponding to larger quantization steps and lower quantization granularities) are to the left in the plot 400 and higher quantization levels (corresponding to smaller quantization steps and higher quantization granularities) are to the right in the plot 400. The image quality at a given compression ratio generally increases as the quantization level is increased, which corresponds to decreasing the quantization steps and increasing the quantization granularity. However, the curves exhibit a "knee" at a particular granularity. Decreasing the granularity below the knee leads to a rapid decline in the image quality and increasing the granularity above the knee provides smaller marginal increases in the image quality.

The same data rate (e.g., file size in bytes) can be achieved using different combinations of compression ratio and quantization level. The functional relationship 405 is determined by selecting the combination of compression ratio and quantization level that provides the highest image quality for a particular file size. This optimal combination of compression ratio and quantization level corresponds to the compression ratio of the curve that has a knee at a quantization level that produces the particular file size. In some embodiments, the functional relationship 405 is approximated by a heuristic formula in which the product of the optimal quantization step and compression ratio is equal to a constant. The constant can be determined empirically using the plot 400 or a corresponding plot for one or more other images. Other functional relationships are also possible. For example, different functional relationships can be determined for different types of images, such as black-and-white images, color images, landscapes, portraits, and the like. For another example, different functional relationships can be determined based on statistical characterizations of the images such as dynamic ranges in the pixel values, average pixel values, and the like. Alternatively, different functional relationships can be determined based on statistical characterization of the measurements, such as the estimated mean and variance of the measurements. In this case, some of the measurements are computed first and the statistical characterization is computed based on those measurements. The compression ratio and quantization level are determined using the target indicator. The compression ratio is used to determine the needed number of measurements and more measurements are acquired to complete the needed number. Since the measurements are derived from the images, their statistical characteristics are, albeit indirectly, also statistical characteristics of the images. However, usage of the statistical characterization of the measurements is of practical importance in cases where the measurements generation is done in the analog domain, e.g. by a lensless camera, and therefore the original images may not available for computing their statistics. Joint image compression and quality control can therefore be performed on the basis of the type of image that is being encoded.

Figure 5:
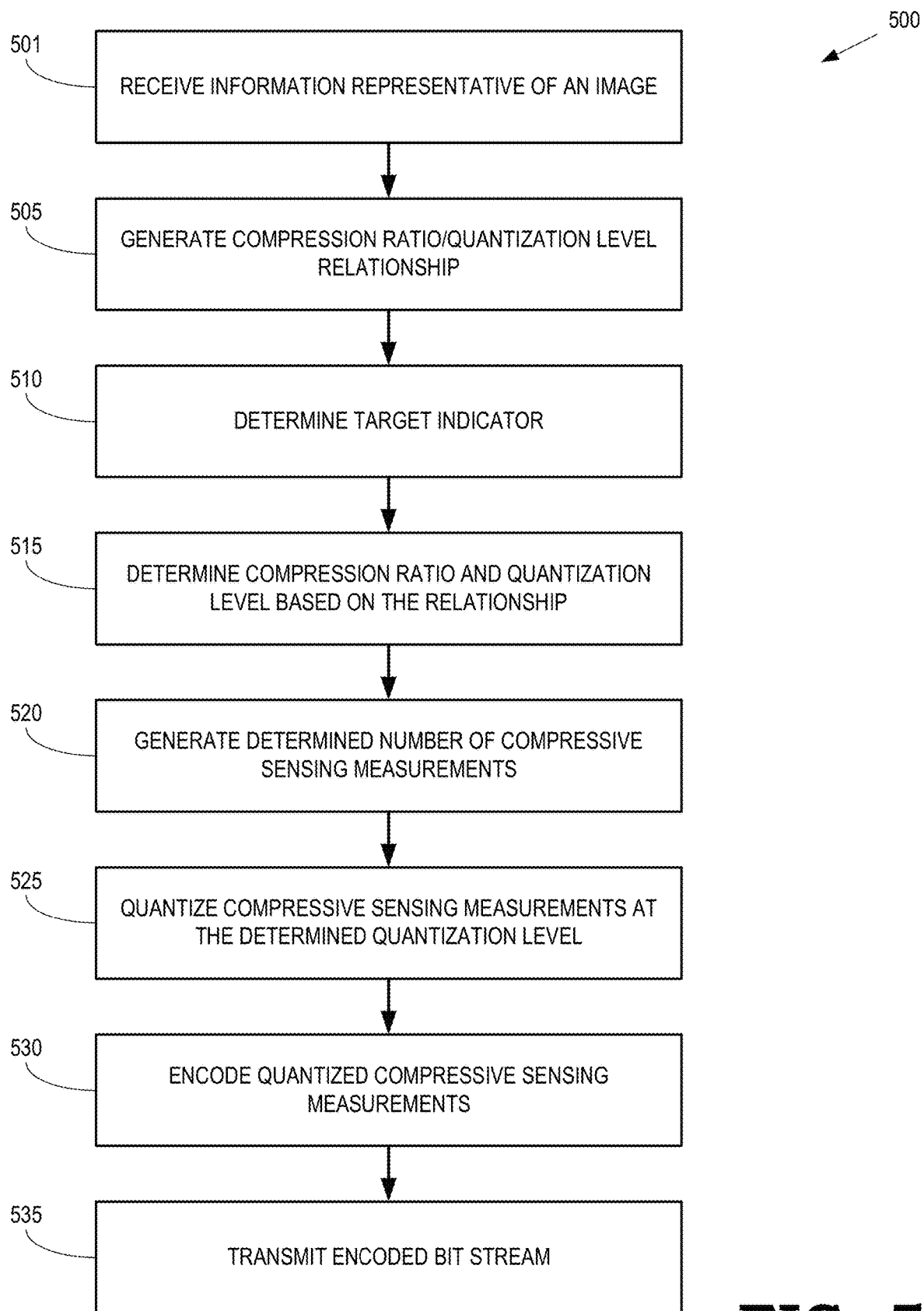
FIG. 5 is a flow diagram of a method for using joint image compression and quality control to encode compressive sensing measurements according to some embodiments.

FIG. 5 is a flow diagram of a method 500 for using joint image compression and quality control to encode compressive sensing measurements according to some embodiments. The method 500 is implemented in some embodiments of the encoding controller 130 shown in FIG. 1, the encoding controller 220 shown in FIG. 2, and the encoder 305 shown in FIG. 3.

At block 501, information representative of an image is received and provided to the encoding controller.

At block 505, a relationship between a compression ratio and a quantization level used to acquire compressive sensing measurements and quantize the acquired measurements is generated. Some embodiments of the encoder that implements the method 500 are configured to generate the relationship based on a set of reference images, as discussed herein. For example, if an image compressing device is configured to compress a sequence of images successively, such as a video camera, the set of reference images for a given image in the sequence of images can include one or more of the images preceding it in the sequence. The encoder can also be configured to access previously generated relationships, such as a functional relationship, which can be determined by another processing device and stored in a memory for subsequent access by the encoder. For example, information specifying the functional relationship between the compression ratio and the quantization level can be generated by an external processor such as the external processor 165 shown in FIG. 1 or the external processor 250 shown in FIG. 2. The information specifying the functional relationship can be stored in a memory that is accessible by the encoder. Other embodiments of the encoder obtain a relationship between a compression ratio and a quantization level based on statistics of the input image, or statistics of a subset of the measurements.

At block 510, a target indicator is determined. For example, the encoder can receive signaling that represents the target indicator.

At block 515, the encoder jointly determines a compression ratio and quantization level based on the relationship between the compression ratio and the quantization level determined in block 505. As discussed herein, the relationship can be represented as a heuristic formula that is calibrated empirically. However, the relationship can also be in other forms such as a theoretically determined analytic formula, a lookup table having entries determined based on comparisons of reconstructed images and reference images, and the like. The compression ratio can be represented by a number of compressive sensing measurements, assuming that the number of pixels in the reconstructed image remains fixed. The quantization level can be represented by quantization step or another suitable form as discussed herein.

At block 520, the determined number of compressive sensing measurements is generated. In embodiments that implement an image acquisition device that performs compressive sensing measurements, such as a lensless camera, the encoder signals the compression ratio to the image acquisition device and then accesses the compressive sensing measurements generated by the image acquisition device. In embodiments that implement an image acquisition device that does not perform compressive sensing, such as a conventional digital camera, the encoder generates a sensing matrix based on the compression ratio and applies the sensing matrix to the image data acquired by the image acquisition device. In some embodiments, the determining of a relationship between a compression ratio and a quantization step used to acquire compressive sensing measurements (at step 505) is based on statistics of a subset of the measurements. In that case, step 520 is performed concurrently with steps 505 and 515. For example, a subset of the measurements is acquired, as specified in this step 520, then step 505 uses those measurements to estimate the statistics of the measurements and determine a relationship between a compression ratio and a quantization step used to acquire compressive sensing. Step 515 is then used to determines the compression ratio and consequently the number of measurements needed. Step 520 is then continued to generate the remainder of the measurements, according to the number of measurements computed at step 515.

At block 525, the encoder quantizes the compressive sensing measurements at the determined quantization level. For example, the encoder can quantize the compressive sensing measurements using a quantization codebook that represents the compressive sensing measurements with labels defined according to a quantization step or quantization granularity.

At block 530, the encoder encodes the quantized compressive sensing measurements. For example, the encoder can apply entropy coding to the quantized compressive sensing measurements to generate a bit stream representative of the encoded measurements.

At block 535, the encoder transmits the encoded bit stream. For example, the encoder can transmit the encoded bit stream to a decoder via a network for eventual display on a screen associated with the decoder.

Figure 6:
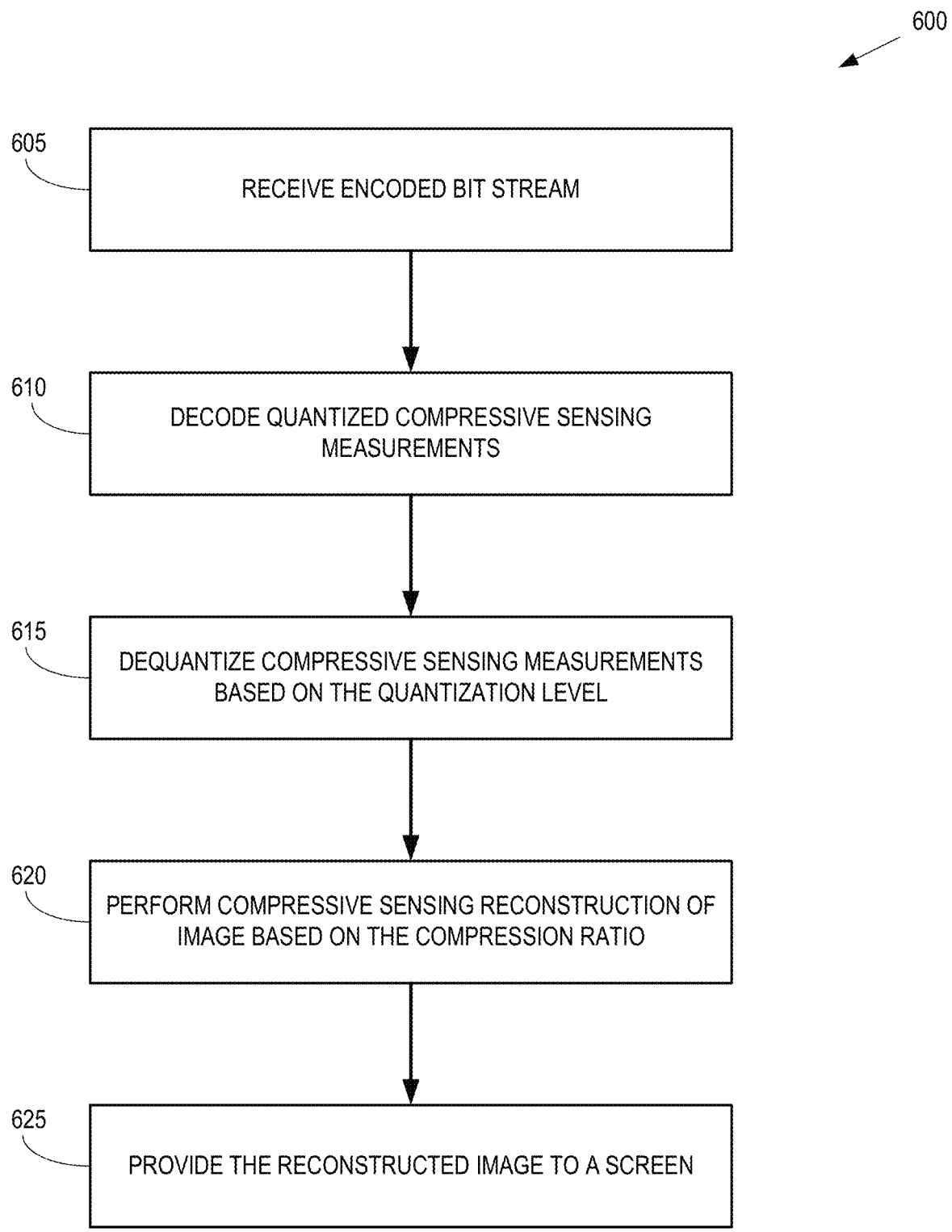
FIG. 6 is a flow diagram of a method for compressive sensing reconstruction of an encoded image formed by encoding compressive sensing measurements using joint image compression and quality control according to some embodiments.

FIG. 6 is a flow diagram of a method 600 for compressive sensing reconstruction of an encoded image formed by encoding compressive sensing measurements using joint image compression and quality control according to some embodiments. The method 600 is implemented in some embodiments of the decoding processor 150 shown in FIG. 1, the decoding processor 235 shown in FIG. 2, and the decoder 335 shown in FIG. 3.

At block 605, the decoder receives an encoded bit stream. As discussed herein, the encoded bit stream is formed by compressive sensing, quantizing the compressive sensing measurements, and then encoding the quantized measurements using entropy coding to generate the encoded bit stream. The bit stream includes information indicating the compression ratio and the quantization level that were used to generate the encoded bit stream. In some embodiments, this information is explicitly indicated using values of a set of bits included in the bitstream to indicate the compression ratio and the quantization level. In other embodiments, the information is implicitly indicated by a set of bits included in the bitstream. For example, a set of bits in the bitstream can include information indicating the compression ratio or the quantization level. The decoder is able to determine or infer the other quantity (e.g., the compression ratio or the quantization level) that was used to generate the encoded bit stream based on the values of the bits.

At block 610, the decoder decodes the quantized compressive sensing measurements. For example, the decoder can use entropy decoding to recover the quantized compressive sensing measurements from the encoded bit stream.

At block 615, the decoder dequantizes the compressive sensing measurements based on the quantization level that was used to quantize the compressive sensing measurements.

At block 620, the decoder performs compressive sensing reconstruction of the image based on the compression ratio that was used for compressive sensing of the image.

At block 625, the decoder provides the reconstructed image to a screen for displaying.

Figure 7:
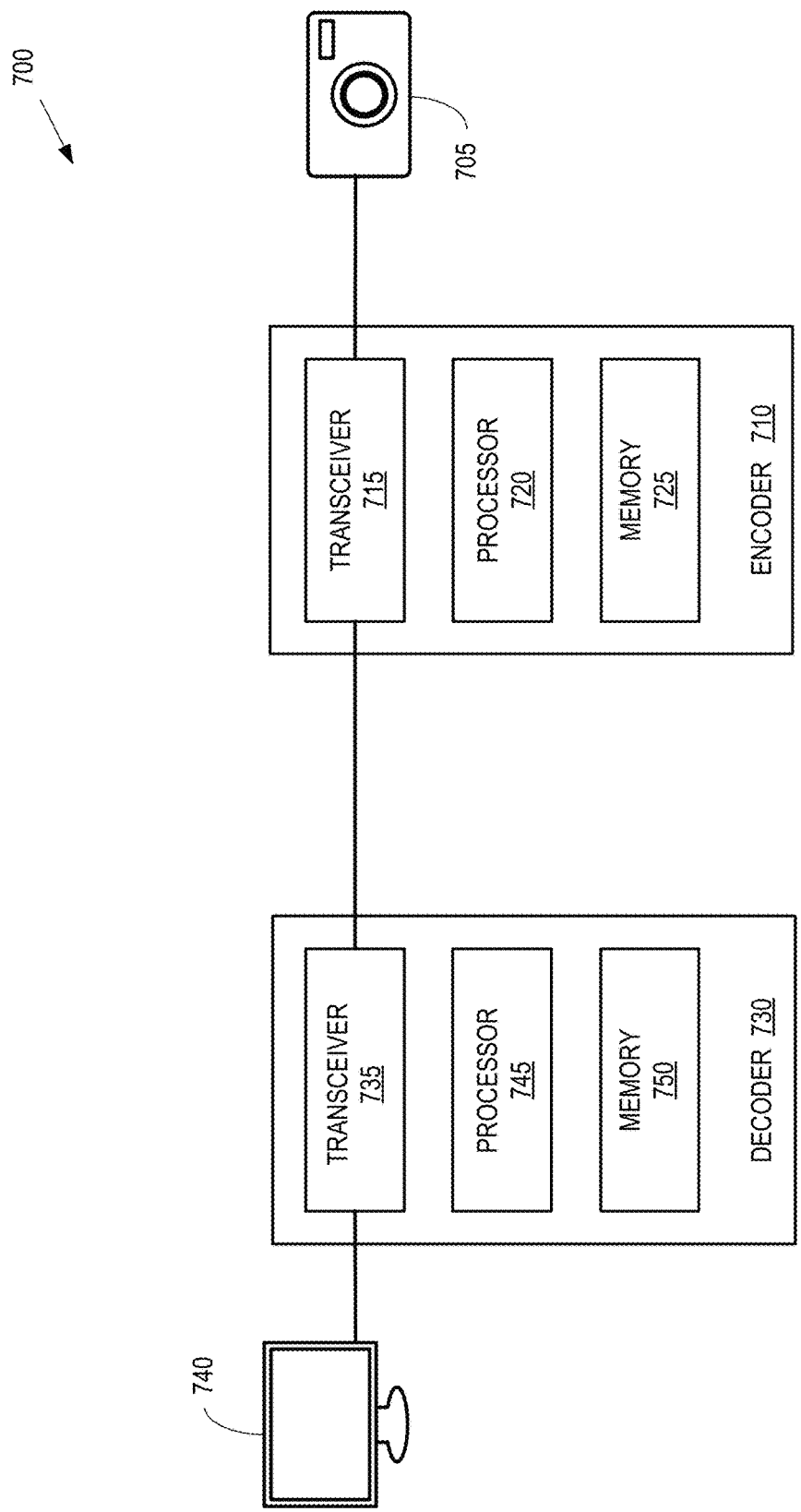
FIG. 7 is a block diagram of a third example of an image acquisition and display system according to some embodiments.

FIG. 7 is a block diagram of a third example of an image acquisition and display system 700 according to some embodiments. The image acquisition and display system 700 includes an image acquisition device 705 such as the lensless camera 105 shown in FIG. 1 or the camera 205 shown in FIG. 2.

The image acquisition and display system 700 also includes an encoder 710 that uses joint image compression and quality control to form an encoded bit stream, as discussed herein. The encoder 710 includes a transceiver 715 that is configured to transmit or receive signals. For example, the transceiver 715 is able to receive signals representative of compressive sensing measurements (if the image acquisition device 705 is configured to perform compressive sensing) or signals representative of an original image acquired by the image acquisition device (if the image acquisition device 705 is not configured to perform compressive sensing). The transceiver 715 can therefore be implemented as a separate transmitter and receiver. The encoder 710 also includes a processor 720 and a memory 725. The processor 720 is configured to execute instructions stored in the memory 725 and to store information (such as the results of executing the instructions) in the memory 725. The encoder 710 is therefore able to implement joint image compression and quality control, e.g., the transceiver 715, the processor 720, and the memory 725 are able to perform some embodiments of the method 500 shown in FIG. 5.

The image acquisition and display system 700 also includes a decoder 730 that is configured to decode encoded bit streams that are formed using joint image compression and quality control, as discussed herein. The decoder 730 includes a transceiver 735 that is configured to transmit or receive signals. For example, the transceiver 735 is able to receive signals representative of an encoded bit stream from the transceiver 715 in the decoder 730. For another example, the transceiver 735 is able to transmit signals representative of a reconstructed image to a screen 740 for display. The transceiver 735 can therefore be implemented as a separate transmitter and receiver. The decoder 730 also includes a processor 745 and a memory 750. The processor 745 is configured to execute instructions stored in the memory 750 and to store information (such as the results of executing the instructions) in the memory 750. The decoder 730 is therefore able to reconstruct images from the encoded bit stream formed using joint image compression and quality control, e.g., the transceiver 735, the processor 745, and the memory 750 are able to perform some embodiments of the method 600 shown in FIG. 6.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
receiving a compressed signal generated from a media signal using a compression ratio for compressive sensing and a quantization level used to quantize compressive measurements of the media signal, wherein the compression ratio and the quantization level are determined based on a target indicator and based on a functional relationship between the quantization level and a number of the compressive measurements of the media signal;
receiving information indicating at least one of the compression ratio or the quantization level; and
decompressing the compressed signal based on the compression ratio and the quantization level.

2. The method of claim 1, wherein:
the functional relationship specifies that one of a product and a quotient of the quantization level, and
the functional relationship specifies that a number of the compressive sensing measurements is equal to a constant.

3. The method of claim 1, wherein decompressing the compressed signal comprises:
applying channel decoding to the compressed signal to form a quantized signal;
dequantizing the quantized signal to generate a dequantized signal; and
performing compressive sensing reconstruction on the dequantized signal to generate a decompressed signal.

4. A decoder comprising:
a transceiver to receive a compressed signal generated from a media signal using a compression ratio for compressive sensing and a quantization level used to quantize compressive measurements of the media signal, wherein the compression ratio and the quantization level are determined based on a target indicator and based on a functional relationship between the quantization level and a number of the compressive measurements of the media signal,
the transceiver to receive information indicating at least one of the compression ratio and the quantization level; and
a processor to decompress the compressed signal based on the compression ratio and the quantization level.

5. The decoder of claim 4, wherein:
the functional relationship specifies one of a product and a quotient of the quantization level, and
the functional relationship specifies that the compression ratio is equal to a constant.

6. The decoder of claim 4, wherein the processor is further configured to:
apply channel decoding to the compressed signal to form a quantized signal;
dequantize the quantized signal to generate a dequantized signal; and
perform compressive sensing reconstruction on the dequantized signal to generate a decompressed signal.

7. A non-transitory computer-readable medium embodying programmed instructions which, when executed by at least one processor, directs the at least one processor to:
receive a compressed signal generated from a media signal using a compression ratio for compressive sensing and a quantization level used to quantize compressive measurements of the media signal, wherein the compression ratio and the quantization level are determined based on a target indicator and based on a functional relationship between the quantization level and a number of the compressive measurements of the media signal;
receive information indicating at least one of the compression ratio and the quantization level; and
decompress the compressed signal based on the compression ratio and the quantization level.

8. The non-transitory computer-readable medium of claim 7, wherein:
the functional relationship specifies one of a product and a quotient of the quantization level, and
the functional relationship specifies that the compression ratio is equal to a constant.

9. The non-transitory computer-readable medium of claim 7, wherein the programmed instructions further directs the at least one processor to:
- apply channel decoding to the compressed signal to form a quantized signal;
- dequantize the quantized signal to generate a dequantized signal; and
- perform compressive sensing reconstruction on the dequantized signal to generate a decompressed signal.

* * * * *